(12) United States Patent
Doyle et al.

(10) Patent No.: US 11,262,654 B2
(45) Date of Patent: Mar. 1, 2022

(54) CHAIN SCISSION RESIST COMPOSITIONS FOR EUV LITHOGRAPHY APPLICATIONS

(71) Applicant: Intel Corporation, Santa Clara, CA (US)

(72) Inventors: Lauren Doyle, Portland, OR (US); Marie Krysak, Portland, OR (US); Patrick Theofanis, Pasadena, CA (US); James Blackwell, Portland, OR (US); Eungnak Han, Portland, OR (US)

(73) Assignee: Intel Corporation, Santa Clara, CA (US)

(*) Notice: Subject to any disclaimer, the term of this patent is extended or adjusted under 35 U.S.C. 154(b) by 33 days.

(21) Appl. No.: 16/728,976

(22) Filed: Dec. 27, 2019

(65) Prior Publication Data
US 2021/0200085 A1 Jul. 1, 2021

(51) Int. Cl.
| | |
|---|---|
| *G03F 7/039* | (2006.01) |
| *C08G 83/00* | (2006.01) |
| *C08F 20/24* | (2006.01) |
| *C08F 30/08* | (2006.01) |
| *G03F 7/20* | (2006.01) |

(52) U.S. Cl.
CPC .......... *G03F 7/039* (2013.01); *C08F 20/24* (2013.01); *C08F 30/08* (2013.01); *C08G 83/003* (2013.01); *C08G 83/005* (2013.01); *G03F 7/2004* (2013.01)

(58) Field of Classification Search
None
See application file for complete search history.

(56) References Cited

U.S. PATENT DOCUMENTS

| | | | | |
|---|---|---|---|---|
| 4,011,351 A | * | 3/1977 | Gipstein | G03F 7/039 430/296 |
| 4,323,695 A | * | 4/1982 | Bloch | C07C 69/653 526/245 |
| 4,382,985 A | * | 5/1983 | Hattori | C08F 2/52 427/488 |
| 4,518,675 A | * | 5/1985 | Kataoka | G03F 7/425 134/38 |
| 4,615,584 A | * | 10/1986 | Ohmori | C08F 20/22 385/143 |

(Continued)

FOREIGN PATENT DOCUMENTS

| | | | | |
|---|---|---|---|---|
| CN | 107151287 A | * | 9/2017 | |
| EP | 0230656 A1 | * | 8/1987 | ............. G03F 7/039 |

(Continued)

OTHER PUBLICATIONS

Babu et al. "Radiolysis of Resist Polymers. 1. Poly(methyl alpha-haloacrylates and Copolymers with Methyl Methacrylate", Macromolecules 1984, 17, 2749-2775 (Year: 1984).*

(Continued)

*Primary Examiner* — Nicole M. Buie-Hatcher
(74) *Attorney, Agent, or Firm* — Essential Patents Group, LLP

(57) ABSTRACT

Chain scission resist compositions suitable for EUV lithography applications may include monomer functional groups that improve the kinetics and/or thermodynamics of the scission mechanism. Chain scission resists may include monomer functional groups that reduce the risk that leaving groups generated through the scission mechanism may chemically corrode processing equipment.

17 Claims, 6 Drawing Sheets

(56) References Cited

U.S. PATENT DOCUMENTS

| | | | | |
|---|---|---|---|---|
| 6,042,997 | A * | 3/2000 | Barclay | G03F 7/039 430/315 |
| 9,581,901 | B2 * | 2/2017 | Jain | G03F 7/004 |
| 2002/0164538 | A1 * | 11/2002 | Allen | G03F 7/0382 430/270.1 |
| 2003/0049561 | A1 * | 3/2003 | Angelopoulos | G03F 7/0392 430/270.1 |
| 2003/0165773 | A1 * | 9/2003 | Harada | G03F 7/0395 430/270.1 |
| 2004/0023153 | A1 * | 2/2004 | Takeda | G03F 7/0392 430/270.1 |
| 2015/0355543 | A1 * | 12/2015 | Takemura | G03F 7/16 430/270.1 |
| 2017/0174808 | A1 * | 6/2017 | Kramer | C08F 220/28 |
| 2020/0233300 | A1 * | 7/2020 | Higo | C08F 212/22 |

FOREIGN PATENT DOCUMENTS

| | | | | |
|---|---|---|---|---|
| JP | 57118243 A | * | 7/1982 | G03F 7/039 |
| JP | 2004317543 A | * | 11/2004 | |

OTHER PUBLICATIONS

Machine translation of Qin et al. (CN 107151287 A), retrieved Oct. 2020 (Year: 2020).*

Machine translation of Kakino (JP 2004317543 A), retrieved Oct. 2020 (Year: 2020).*

Machine translation of JP 57118243 A, retrieved Mar. 2021 (Year: 2021).*

Tada "Highly Sensitive Positive Electron Resists Consisting of Halogenated Alkyl alpha-Chloroacrylate Series Polymer Materials", J. Electrochem. Soc., 1983, 130, 912-917 (Year: 1983).*

* cited by examiner

CHAIN SCISSION RESIST COMPOSITIONS FOR EUV LITHOGRAPHY APPLICATIONS

BACKGROUND

Semiconductor device manufacturing continues to reduce the physical dimensions of features, such as transistor gates, gate contacts, and metal interconnects, in the pursuit of greater integrated circuit (IC) density. Nanolithography is a key enabler of each successive manufacturing technology node. Multipatterning with immersion deep ultraviolet (DUV) nanolithography technology can achieve line-space dimensions in the 40 nm pitch range, which is typical of the 7-10 nm CMOS technology nodes. However, to achieve feature dimensions in the 20-30 nm range, extreme ultraviolet lithography (EUV or EUVL) technology using the 13.5 nm EUV center wavelength (13.3-13.7 nm band) will likely be necessary.

In positive photoresist systems, photoresist exposed to the lithography wavelength becomes soluble in a developer while unexposed photoresist is to remain insoluble. Photoresist systems are typically designed according to the wavelength employed in a lithography technology, for example because a photoresist should have high transparency, high sensitivity, and provide a high contrast pattern when processed at the lithography wavelength.

Chemically amplified resists are widely employed in current generation nanolithography. In a chemically amplified resist (CAR), one photo-event initiates a reaction, for example through a photo-acid generator (PAG), which induces a polymer cleavage that in turns generates additional acid that can then promote further polymer cleavages in a cascade of additional chemical reactions. Although sensitive, CARs suffer from resolution limitations that may preclude their use in EUV applications. Line edge roughness (LER) is a parameter that characterizes variations a resist feature along one edge of the feature. LER in CARs is thought to be associated with a number of statistically fluctuating effects such as photon shot noise (photon flux variations), distributions of photo-acid generators within nanometer dimensioned regions of the resist, random variation in acid diffusion during chemical amplification, and the nonzero size of resist polymers dissolved during develop. CARs may therefore suffer stochastic failures in EUV lithography applications.

In view of these problems, a non-chemically amplified resist may be advantageous for EUV lithography. A chain scission resist is one type of non-chemical amplified (non-CA) resist that has been in use for electron-beam (e-beam) lithography for a number of years. For e-beam lithography, chain scission resists include a polymer that will undergo degradation as a result of electron-solid interactions induced through electron-beam exposure. Upon scission, fragmented chains are dissolvable in a suitable developer for positive-tone imaging. One chain scission resist that has exhibited good sensitivity to e-beam radiation is high molecular weight poly-(methyl methacrylate) (PMMA) having a monomer structure expressed by the general structural formula:

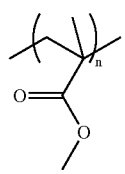

(1)

Another chain scission resist that has found use primarily in e-beam applications is a 1:1 copolymer of α-chloromethacrylate and α-methylstyrene, which is commercially available from Zeon Chemicals Co. under the trade name of ZEP, and is expressed by the general structural formula:

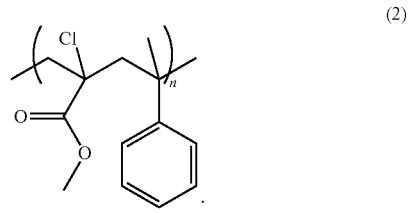

(2)

While these chain scission resist materials display much lower chemical variation resulting in more uniform films than CARs, they are slow in EUV applications, as the EUV radiation energy level is lower than that of e-beam lithography. Although molecular weights of chain scission polymers can be manipulated to improve speed to some extent, such a technique comes at the cost of resolution, reducing an advantage chain scission resists have over CARs. These chain scission resist materials may also induce issues with manufacturing equipment if they were to be implemented in a high volume manufacturing environment. As such, new chain scission resist compositions better suited to EUV applications would be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
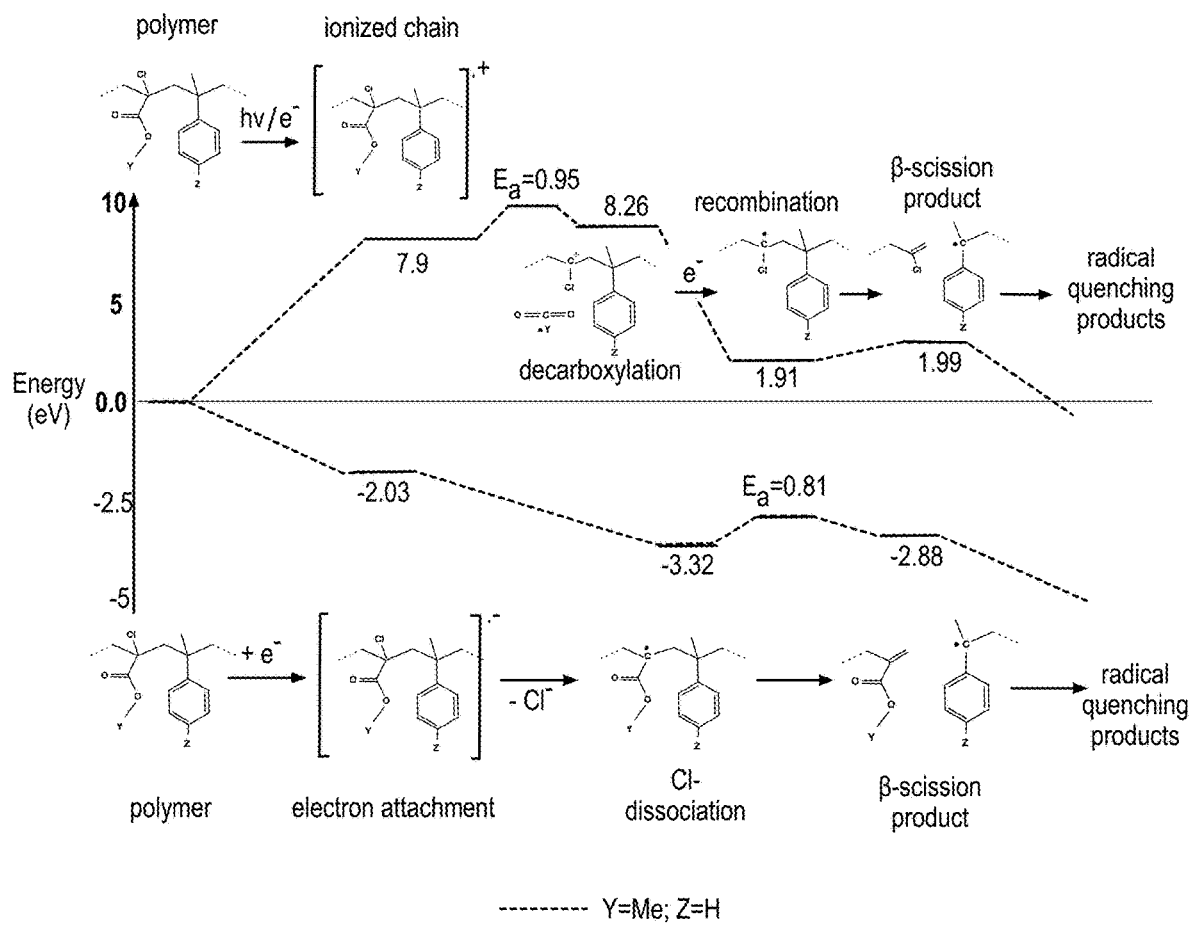
FIG. 1 is a diagram illustrating a high energy chemical pathway and a low energy chemical pathway modeled for a baseline chain scission resist.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that some embodiments may be practiced without these specific details. In some instances, well-known methods and devices are shown in block diagram form, rather than in detail, to avoid obscuring other aspects of an embodiment. Reference throughout this specification to "an embodiment" or "one embodiment" means that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In accordance with some embodiments herein, chain scission resists suitable for EUV lithography applications include monomer functional groups that improve the kinetics and/or thermodynamics of the scission mechanism. In accordance with further embodiments, chain scission resists suitable for EUV lithography applications include monomer functional groups that reduce the risk that leaving groups generated through the scission mechanism may chemically corrode equipment processing a high volume of workpieces (e.g., semiconductor wafers) that have been coated with the chain scission resist.

Embodiments of positive tone chain scission resist compositions described herein may be employed in any (nano) lithography application, but may be particularly advantageous for direct EUV print applications, which may be enlisted in high volume microelectronics fabrication, for example at the sub-7 nm complementary metal-oxide-semiconductor (CMOS) technology node. In contrast to multipatterning, direct printing is a single patterning using a single reticle mask, rather than two or even three masks typical of multipatterning. Improved kinetics displayed by the resist compositions described further below may enable sufficiently small printed feature pitches to avoid the use of complex Edge Placement Error (EPE) mitigation schemes. Improved kinetics displayed by the exemplary resist compositions described further below may also have higher efficiency (sensitivity), allowing for lower doses and higher scanner throughput. Although these advantages are particularly important in the context of direct EUV print applications, various embodiments of chain scission resist compositions described herein may also be applicable to e-beam lithography applications.

In accordance with embodiments herein, a chain scission resist material comprises a polymer that will undergo one or more chain scission mechanisms upon exposure to EUV radiation. In some embodiments, the polymer is a homopolymer comprising primarily a single monomer. In other embodiments, the polymer is a copolymer comprising primarily two or more monomers of distinct chemical composition. In some exemplary embodiments, the chain scission resist comprises a plurality of acrylate-based monomers, and has the structural formula:

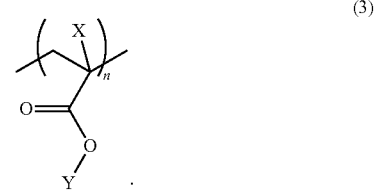

(3)

In accordance with some embodiments, one or more functional group within monomer structure (3) is selected to improve the polymer's EUV sensitivity and/or reduce the chemical corrosivity of chain scission reaction products. The functional group represented in the above structure by 'X' is a suitable "leaving group," as further described below. The functional group represented by X may also be an "EUV absorbing group," as further described below. The functional group represented in the above structure by 'Y' may advantageously stabilize cationic or radical intermediates of one or more scission reaction pathways, as further described below. In addition to, or in the alternative, the functional group represented by Y may also be an EUV absorbing group, as further described below. In contrast to e-beam applications, in EUV applications some photon energy may coincide with material absorption bands so that sensitivity may be improved through photochemical effects as well as the radiation chemical effects associated with energies exceeding C—C bond energy where electron-solid interactions become important.

The monomer structure (3) may be employed in homopolymer scission resist embodiments where X and Y do not vary. The monomer structure (3) may also be employed in copolymer scission resist embodiments where at least one of X and Y in a first monomer of the copolymer differs from X and Y in a second monomer of the copolymer. The monomer structure (3) may also be employed in copolymer scission resist embodiments further including a monomer having a styrene-based structure. In some exemplary embodiments, such a copolymer has the structural formula:

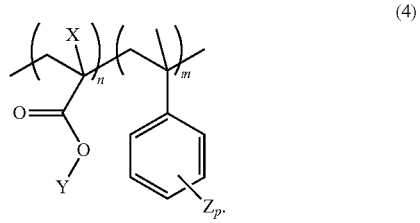

(4)

For the copolymer structure (4), X may again be a leaving group, and/or may be an EUV absorbing group, as further described below. Similarly, Y may again stabilize cationic or radical intermediates, and/or may be an EUV absorbing group. In structure (4), the functional group represented 'Z' is advantageously an "electron donating group." As described further below, functional group Z may help the aromatic group to stabilize a radical intermediate of the chain scission mechanism, improving the chain-scission efficiency relative to a baseline α-methylstyrene structure. In addition, or in the alternative, the functional group represented by Z may be an EUV absorbing group. As denoted by the subscript, p, there may be 1 to 5 of the Z functional groups with hydrogens of the aromatic group being fully substituted when p=5. For some exemplary embodiments, a resist having copolymer structure (4), the n:m ratio is 1:1, but the ratio may vary, for example from about 10:1 to 1:10. Number average molecular weights of both homopolymer and copolymer embodiments may vary widely, for example from (Mn) of 2,000 to 500,000.

Through both quantum chemical modeling and the collection of experimental data, the inventors have found that longer-chain aliphatic groups on the acrylate monomer of structures (3) or (4) tend to increase the efficiency of the scission mechanism. The inventors have further found that the incorporation of electron-donating groups in the methylstyrene monomer of structure (4) also tend to increase the efficiency of the scission mechanism. Although these two strategies may be practiced separately, in some embodiments, both strategies are applied in combination in copolymer structure (4). The inventors have further found that the inclusion of functional groups offering higher EUV-absorption into the monomers of either structure (3) or (4) can also increase efficiency of the scission mechanism. The inventors have also determined that the risk of producing chemical corrosive chain scission by-products can be reduced by including leaving groups in either structure (3) or (4) that are the least volatile in solution and/or the least prone to forming an acid.

FIG. 1 is a diagram illustrating a high-energy chemical pathway and a low-energy chemical pathway modeled for a baseline chain scission resist. The diagram shown in FIG. 1 was generated through quantum chemical simulations executed using a high-performance computational chemistry software package. Density functional theory, with the popular B3LYP hybrid density functional and a 6-311G** Pople-style basis set, was employed to calculate self-consistent field energies (SCFE) for representative polymer fragments. The SCFE represents the thermodynamic internal energy, U, at 0 K. Solvent corrections were added using a dielectric constant of 4.0 with conductor-like screening model (COSMO) in order to account for screening of charged species by the polymer resin.

The simulations indicate that for a baseline chain scission resist having the structure (2), introduced above, there are two predominant reaction pathways that may lead to chain scission. Both pathways are illustrated in FIG. 1. There is a low-energy dissociative attachment pathway that proceeds first by attachment of a low energy (e.g., <3 eV) electron to a neutral polymer chain. A low energy electron could be an electron having low kinetic energy at its creation (e.g., by photoionization or impact ionization), or it could be any electron that has lost kinetic energy through collision, for example with electron clouds of the polymer resin. Continuing along the low energy pathway shown in FIG. 1, a subsequent ejection of a chloride anion results in a radical centered on the polymer backbone. Entropically driven β-scission from the polymer radical results in formation of two chain fragments as the β-scission products shown in the low energy pathway of FIG. 1. One of the chain fragments has a terminal olefin, and another of the chain fragments has a radical terminus. For the baseline polymer composition where Y is a methyl group and Z is hydrogen, β-scission is the rate limiting step in this lower energy pathway, though the barrier is low enough (calculated as ~0.81 eV) that the reaction should complete at room temperature in microseconds.

There is also a high-energy pathway that begins with ionization of the polymer chain, as further illustrated in FIG. 1. The ionization may be either EUV photoionization or impact ionization from a high-energy secondary electron. The resulting radical cation species can undergo decarboxylation, generating an aliphatic group (Y) radical and a polymer chain cation. As shown, this is the rate-limiting step for the high-energy pathway. Electron/ion recombination of the chain cation results in a chain radical from which β-scission can occur. Finally, radical quenching of the radical chain terminus may occur in many ways for both the low and high-energy pathways, with such quenching generally being exothermic by 1-3 eV.

The simulation technique demonstrated in FIG. 1 has been further enlisted to probe alternative pathways that may exist when one or more of the X, Y, and Z functional groups of structure (4) are modified from the baseline structure (2), for example to stabilize reactive intermediates and/or otherwise improve the reaction kinetics so as to increase EUV sensitivity. Although simulated for structure (4), similar effects are expected for structure (3) as compared to a baseline structure (1).

The X Substituent Group

As noted above, either of polymer structures (3) or (4) may include a variety of substituent groups represented by X. In some embodiments, the substituent is a leaving group such as a halide (e.g., X being any of Cl, F, Br, or I bonded to the backbone carbon). One concern is that the chain scission material comprising copolymer structure (2), for example, will generate a chloride anion that could potentially bind with a proton to form HCl, and outgas from a resist film at some point following exposure (e.g., within a EUV scanner and/or during a post-exposure bake, etc.). Over time, in a high volume manufacturing environment this to could lead to chemical corrosion of various pieces of hardware within one or more manufacturing tools. This problem may be resolved in some advantageous embodiments where X in the structures (3) or (4) comprise a halide other than chlorine, or other good anionic leaving groups such as a tosylate (toluenesulfonate) group, a triflate (trifluoromethanesulfonate) group, or a triflimide (bissulfonimide) group, or a trifluoroacetate group.

In further embodiments, the X functional groups denoted in structures (3) or (4) may also be EUV absorbing groups that improve sensitivity of the scission resist and lead to a different chain scission mechanism where X is not a leaving group. The EUV absorbing group may be an alkyl halide, with some exemplary EUV absorbing groups being fluoroalkyl substituents (e.g., —$CF_3$, —$CF_2CF_3$, —$CF_2CF_2CF_2CF_3$), which can have significant EUV absorbance.

The Y Substituent Group

As noted above, in some embodiments the functional group Y may advantageously stabilize the development of positive charge and/or radical character during the chain cleavage reaction. A variety of aliphatic or aromatic groups may offer greater stability than the baseline. Some specific aliphatic examples are a methyl group, or an ethyl group, or a propyl group, or an isopropyl group, or a tert-butyl group. Aryl group embodiments, for which an R group is between the O and the aryl constituent, may offer more stability than do aliphatic groups. In one example, the functional group Y is a benzyl group (—$CH_2Ph$) with $CH_2$ between O and the phenyl group. In some alternative embodiments, the functional group Y is a trialkylsilylethyl ($R_3SiCH_2CH_2$— where R is an alkyl substituent), which may similarly act to stabilize the development of positive charge and/or radical character within the chain scission pathway. Exemplary trialkylsilyl groups include a trimethylsilyl ($SiMe_3$) group, a triethylsilyl ($SiEt_3$) group, or a triphenylsilyl ($SiPh_3$) group. Any of these trialkylsilyl groups may be at the terminus of an ester carbon chain that includes 1-10 carbon atoms. For stabilizing positive charge development, having two carbons between Si and O will best allow hyperconjugation to stabilize charge. Hence, in some advantageous trialkysilyl embodiments, there are two —$CH_2$ groups between the O and the Si atom (e.g., a trimethylsilylethyl-substituent).

In some other embodiments, Y is an EUV absorbing substituent functional group. Exemplary EUV absorbing groups include alkyl halides and aryl halides. For such embodiments, the halide is advantageously a fluoride or iodide, for example to avoid potentially corrosive chain scission byproducts. In some examples, the Y group is a fluoroalkyl, fluoroarene, iodoalkyl or iodoarene. Fluoroalkyl embodiments may comprise an ester carbon chain having 1-10 carbon atoms off the O atom in structure (3) or (4). In some exemplary fluoroalkyl embodiments, the fluoroalkyl is completely saturated with fluorine (i.e., a perfluoroalkyl). For example, the Y group may be a trifluoromethyl (—$CF_3$) group, or a pentafluoroethyl group (—$CF_2CF_3$). In aryl halide embodiments, an R group comprising one or two carbon atoms is advantageously between the O atom and the aryl halide (e.g., fluoroarene) substituent. For example, the fluoroarene may be a pentafluorophenyl ($C_6F_5$—) or 3,5-bis-trifluoromethylphenyl (3,5-$(CF_3)_2$—$C_6H_3$—) group.

The Z Substituent Group

In structures (3) and (4), the Z group may participate in the chain scission reaction pathway as an electron donating group. Electron donating groups in accordance with embodiments herein are more electron rich than hydrogen, with some Z substituent group examples being: an alkyl group (—$C_nH_{2n-1}$), or an alkoxy (—OR) group such as methoxy, ethoxy etc., or an amino (—$NH_2$, -$Me_2N$) group, or a hydroxyl (—OH) group. Independently, the Z functional group may be an EUV absorbing group that improve sensitivity of the scission resist. Hence, in some embodiments Z is an electron donating group, but not a significant EUV absorber. In other embodiments, Z improves EUV absorbance but does not significantly participate as an electron donating group. As an EUV absorbing group, Z may be an alkyl halide, and more specifically may be a fluoroalkyl group (e.g., —$CF_3$, —CHF2).

Figure 2:
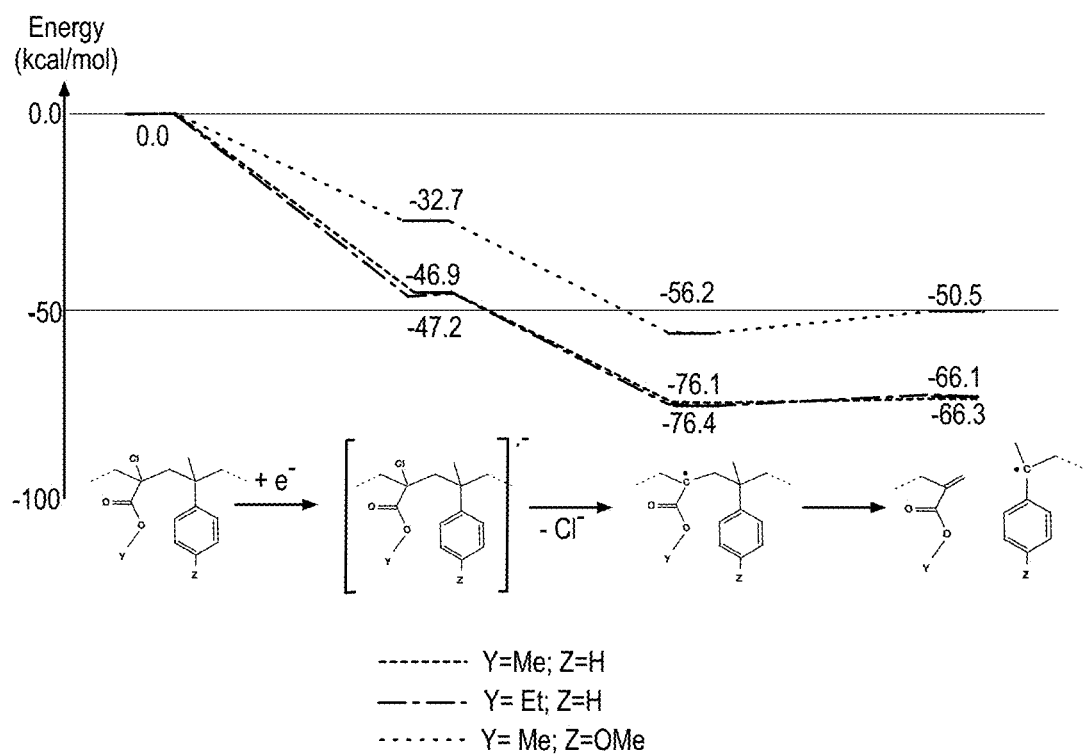
FIG. 2 is a diagram illustrating a comparison of the low energy chemical pathway modeled in FIG. 1 with two chain scission resists, in accordance with some embodiments.
Figure 3:
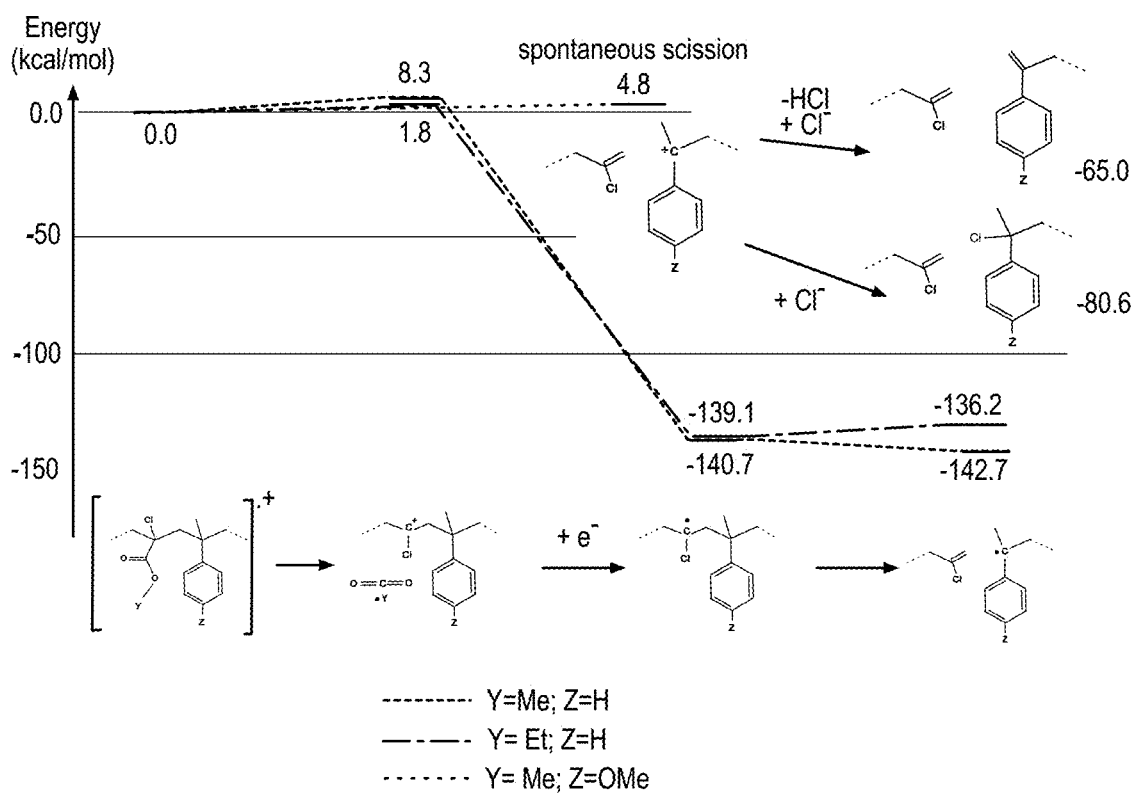
FIG. 3 is a diagram illustrating a comparison of the high energy chemical pathway modeled in FIG. 1 with two chain scission resists in accordance with some embodiments.

FIG. 2 is a diagram illustrating the low-energy chemical pathway modeled in FIG. 1 compared with two chain scission resists in accordance with some embodiments. FIG. 3 is a diagram similarly illustrating the high-energy chemical pathway modeled in FIG. 1 compared with two chain scission resists in accordance with some embodiments. FIG. 2 and FIG. 3 demonstrate how a different aliphatic ester group Y, and electron donating group, Z, can each impact the energy landscape for at least one of the low-energy and high-energy chain scission pathways. For the diagrams in FIGS. 2 and 3, lower energy values are advantageous as more energetically favorable.

In FIG. 2, the low-energy pathway introduced in FIG. 1 is further illustrated as the baseline of comparison for a first resist embodiment where Y is an ethyl group rather than a methyl group. In this embodiments of the copolymer structure (4), Z is hydrogen. A third treatment is illustrated as a second resist embodiment in which Z is instead a methoxy group while Y is a methyl group. As shown in FIG. 2, with Y an ethyl ester group, the low-energy scission pathway of the copolymer structure (4) does not change significantly than the baseline resist having a methyl group. This is expected because there is not a significant electronic modification to the leaving group chloride, or to the polymer chain radical species. The introduction an electron donating group, like the methoxy group in the third treatment, increases the overall electron richness of the polymer chain and this decreases its electron affinity. This makes electron attachment systematically less energetically favorable, which is evident in the overall positive shift of the low energy chain scission pathway compared to the baseline copolymer structure (2).

In FIG. 3, the high-energy pathway introduced in FIG. 1 is further illustrated as the baseline for comparison of the same resist embodiments for which the low-energy pathway was compared in FIG. 2. As shown in FIG. 3, inclusion of the ethyl ester in structure (4) also has little impact beyond a making the β-scission slightly less favorable. However, the benefits of introducing the electron donating methoxy group to the copolymer are clearly evident in the high-energy pathway, specifically with respect to photoionization. Notably, the energy reference state in FIG. 3 is the photoionized species, which is roughly 180 kcal/mol above the neutral ground state. Subsequent to ionization, with the methoxy group the copolymer spontaneously fragments into a new olefin terminus and a cation terminus. Although not bound by theory, the inventors attribute this result at least in part, to the cation being stabilized by the electron donating methoxy group. This is a new scission pathway that is barrier-less, unlike the high-energy decarboxylation scission pathway. This new scission pathway may complete with a quenching of the cation terminus through an addition of a chloride anion, or deprotonation by chloride to form hydrochloric acid. Both products are formed in an exothermic fashion. The modeled results for the methoxy group indicate a similar effect may be expected for the other electron donating groups listed above.

Figure 4A:
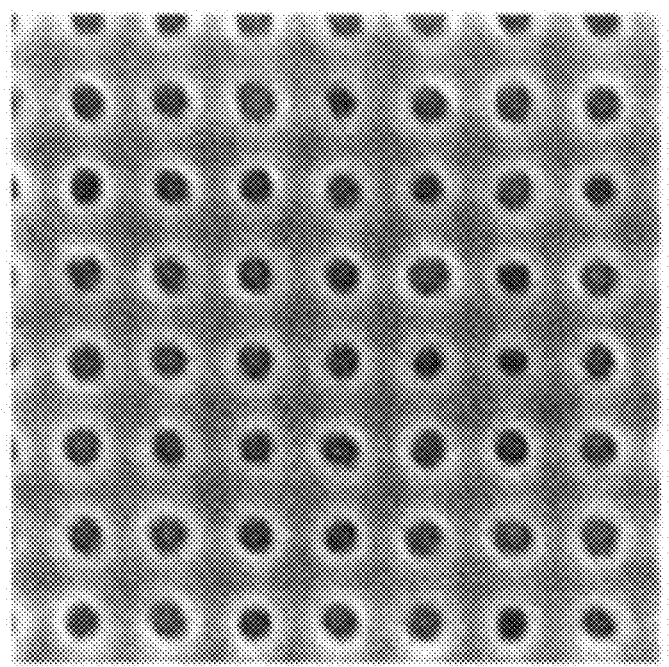
FIG. 4A is a scanning electron microscopy (SEM) image of an array of contact holes patterned into a baseline chain scission resist.
Figure 4B:
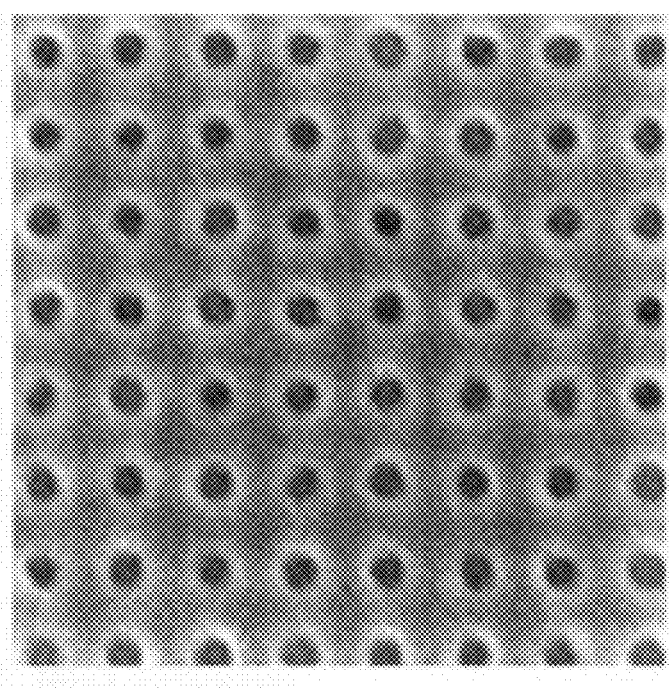
FIG. 4B is a scanning electron microscopy (SEM) image of an array of contact holes patterned into a chain scission resist, in accordance with some embodiments.

The inventors have assessed the above simulations through experiment. FIG. 4A is a scanning electron microscopy (SEM) image of an array of contact holes patterned into the baseline chain scission resist for which the scission pathways are modeled in FIG. 1-3. FIG. 4B is a scanning electron microscopy (SEM) image of an array of contact holes patterned into a chain scission resist, in accordance with a chain scission resist comprising the copolymer structure (4) where Y is an ethyl group (and Z is hydrogen). At similar feature sizes (CD of 22 in FIG. 4A and 23 nm in FIG. 4B), and uniformity (1.9 nm in FIG. 4A and 2.1 nm in FIG. 4B), the introduction of the ethyl group led to a 37% dose improvement, indicating that the scission resist resolution is at least maintained while the scission resist sensitivity is significantly improved. Although not bound by theory, in view of the similarity seen in the modeled reaction pathway kinetics of FIG. 2-3 the inventors currently attribute the improvement seen in the experimental results to the ethyl ester having improved physical dissolution properties of the scission resist.

Figure 5:
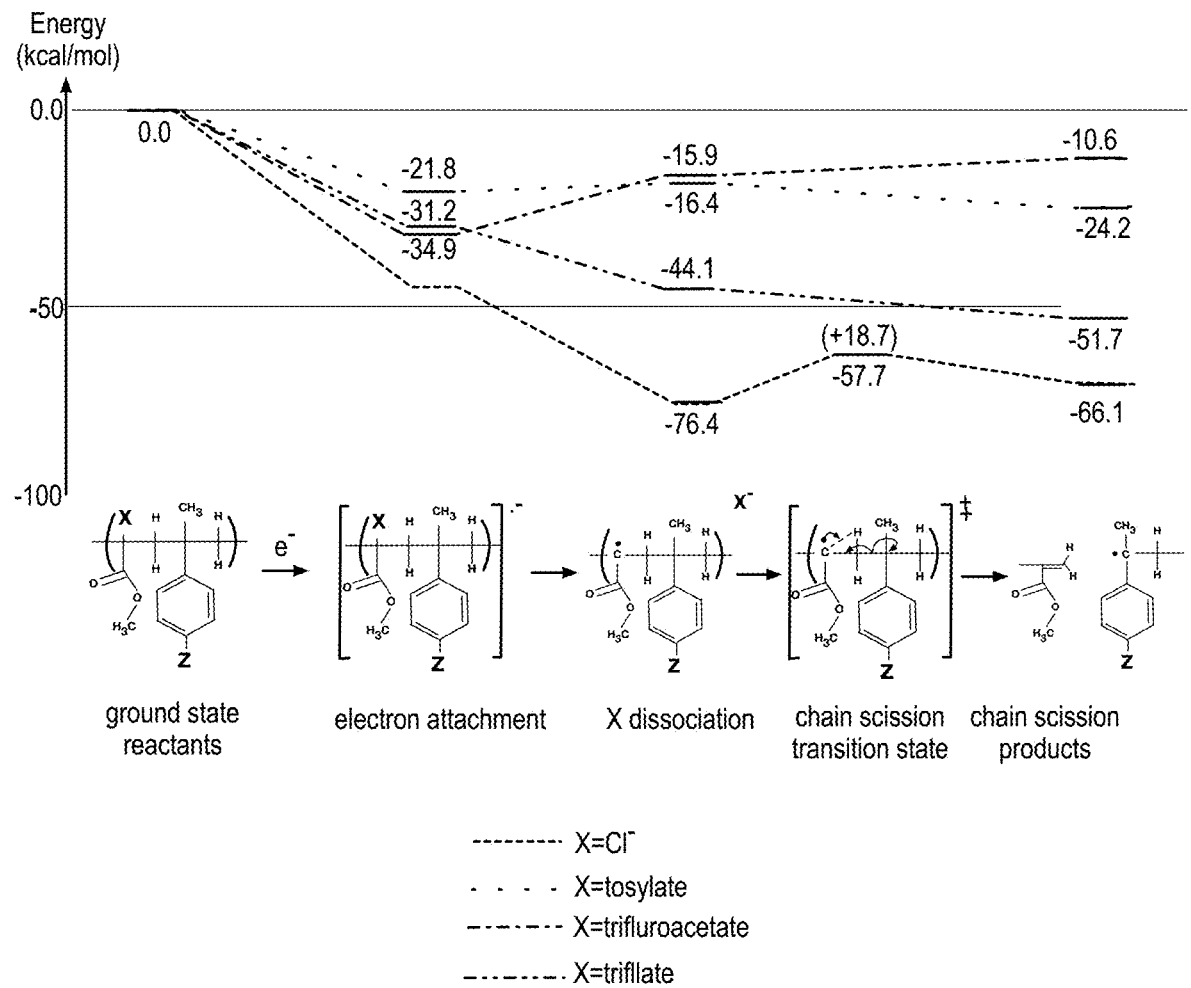
FIG. 5 is a diagram illustrating a comparison of the low energy chemical pathway modeled in FIG. 1 with three chain scission resists, in accordance with some embodiments.

FIG. 5 is a diagram illustrating a comparison of the low energy chemical pathway modeled in FIG. 1 for the baseline resist composition with that of three chain scission resists are in accordance with some embodiments. The diagram in FIG. 5 illustrates reaction energetics along the low-energy chain scission pathway determined through model simulations substantially as introduced above. For these embodiments, the Y and Z functional groups are maintained at the baseline condition with the chain scission reaction kinetics illustrating only the effect of different leaving groups. Specifically, in FIG. 5, tosylate, triflate and trifluoroacetate embodiments are compared with a baseline scission resist copolymer structure (2). As shown, triflate and tosylate groups result in fully exothermic pathways, although they are not as energetically favorable as the chlorine pathway. However, all of these alternative leaving groups should be less volatile in solution and less prone to form an acid. Even if they were to form an acid, their mass and molecular volume should reduce diffusion and outgassing relative to HCl.

As the various effects of each of the X, Y and Z functional groups have been independently assessed, it is noted that various embodiments herein may include one of the X, Y or Z functional groups specified above either alone or in combination with one or more of the other specified functional groups in either homopolymer or copolymer structures. For example, a homopolymer with monomer structure (3) may include only one of the X functional groups described herein, or may include one of the X functional groups described herein and one of the Y functional groups as further specified herein, or may included only one of the Y functional groups described herein. Any permutations of the various X, Y Z functional groups described herein may also be included within copolymer structure (4). For example, a copolymer may include only one of the X functional groups described herein, or a copolymer may include only one of the Y functional groups described herein, or may include only one of the Z functional groups described herein. Alternatively, a copolymer may include any pairwise combination of the X functional groups, Y functional groups, and Z functional groups. Alternatively, a copolymer may include one of the X functional groups in combination with one of the Y functional groups, and in further combination with one of the Z functional groups described herein.

Polymer Chain Architecture

Figure 6A:
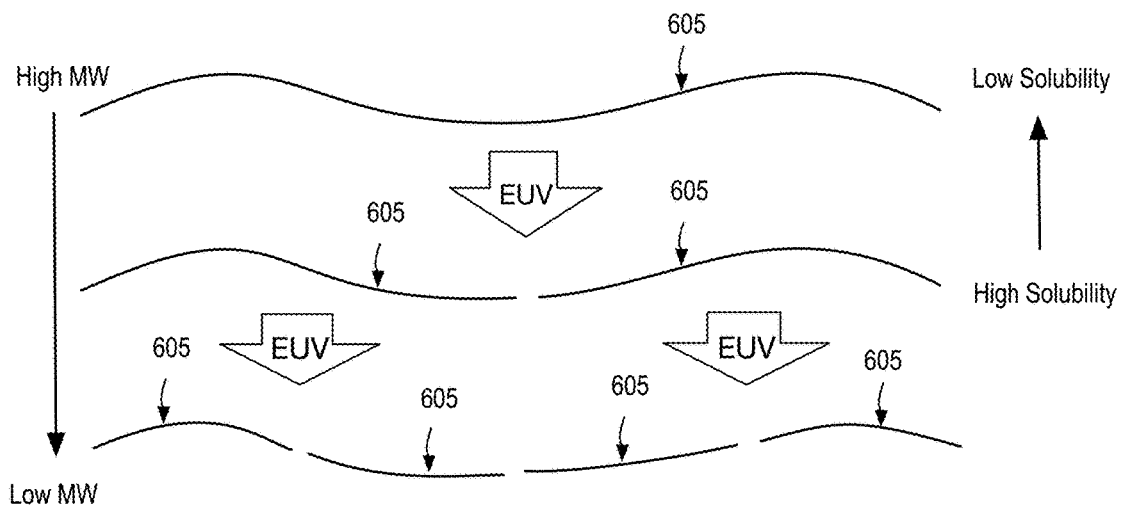
FIG. 6A is a schematic illustrating a linear polymer architecture for a chain scission resist, in accordance with some embodiments.

In some embodiments, a polymer having structure (3) or (4) with any of the X, Y or Z functional groups as described above has a linear chain architecture, for example as illustrated in FIG. 6A. Linear chain 605 has substantially no branching. Locations along linear chain 605 therefore undergo scission in response to EUV exposure during a resist patterning operation, for example according to one or more of the pathways described above. As illustrated, chain scission events reduce the molecular weight of the linear chains, which is the primary basis for an increasing solubility of the resist film within a developer. However, depending on where scission occurs, the impact upon molecular weight of linear chain 605 can be highly variable. For example, as shown in FIG. 6A, scission near the middle of a linear polymer of highest molecular weight will bifurcate linear chain 605 into two linear component chains that each have a most dramatically lower molecular weight (e.g., around half the initial weight). Such a large molecular weight reduction will therefore greatly increase solubility in a developer. As further illustrated in FIG. 6A, scission events of lower molecular weight chains will less dramatically alter the molecular weight and solubility, with a similar muted effect occurring if scission is more near an end of a large molecular weight linear chain.

In some advantageous embodiments, a resist composition comprises a polymer with a branched chain architecture. Notably, branched polymers in accordance with embodiments herein may have monomer structure (1), or monomer structure (3), or copolymer structure (2), or copolymer structure (4). For structures (3) or (4), the X, Y or Z functional groups may be substantially as described above, and the advantages described above in the context of chain scission pathways are equally applicable to branched polymer embodiments.

Relative to a linear chain polymer of similar molecular weight, a branched chain polymer may improve stochastic performance as well as contrast of the resist. For a given molecular weight, a branched polymer may result in fewer polymer aggregates within a resist film than a linear polymer. Such aggregates are currently thought to lead to stochastic variations, so a reduction in aggregation can reduce stochastic effects. Because a branched polymer has a more organized structure, scission may also induce a more consistent (less varied) molecular weight change relative to a linear polymer of similar molecular weight. This effect may also improve contrast of the resist. Additionally, as further described below, some branched polymer architectures may introduce a threshold mechanism by which solubility may be modulated through more than a molecular weight change. For example, the chemical nature of the polymer may be varied between a first state associated with a greater branching, and a second state associated with a lesser branching resulting from scission pruning of one or more branches. This effect may also improve resist contrast, for example.

Figure 6B:
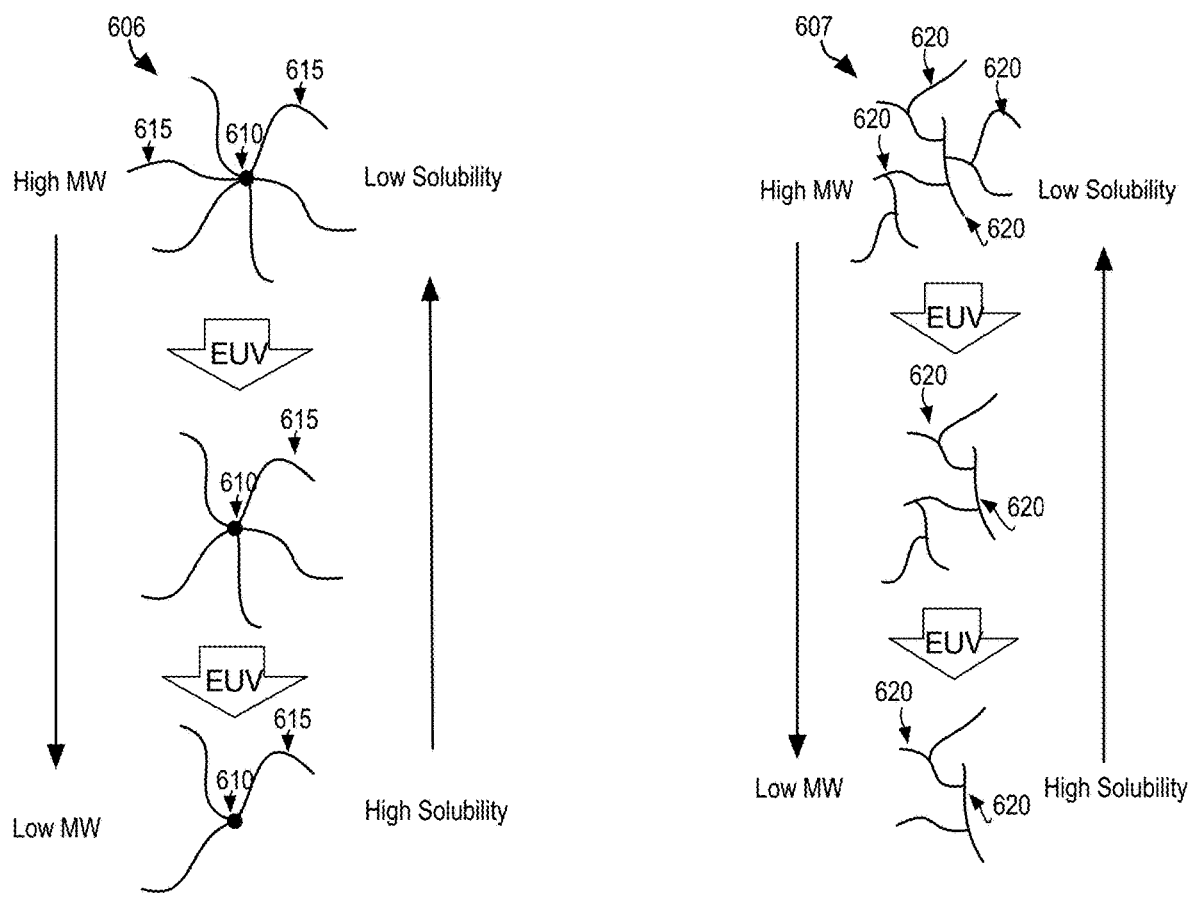
FIG. 6B is a schematic illustrating a star polymer architecture for a chain scission resist, in accordance with some embodiments.
Figure 6C:
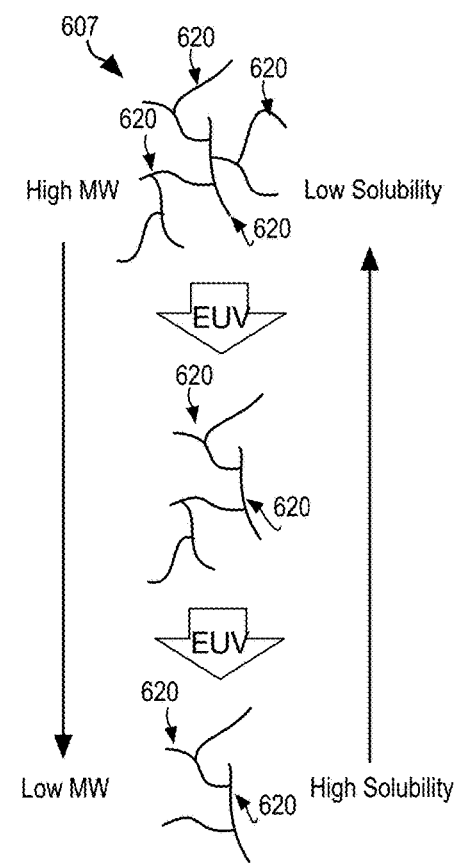
FIG. 6C is a schematic illustrating a hyperbranched polymer architecture for a chain scission resist, in accordance with some embodiments.
Figure 6D:
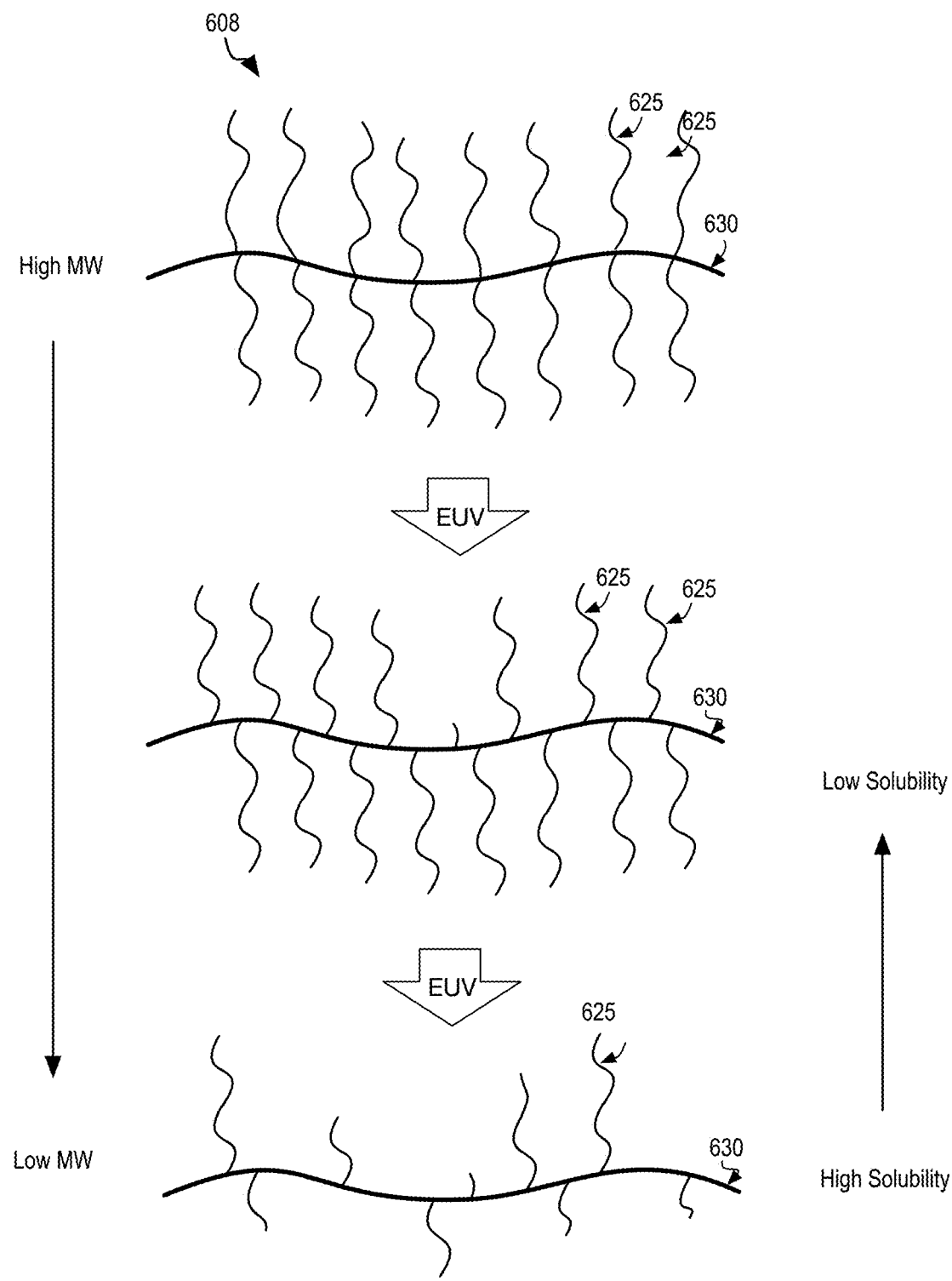
FIG. 6D is a schematic illustrating a bottlebrush polymer architecture for a chain scission resist, in accordance with some embodiments.

FIGS. 6B, 6C and 6D illustrate three exemplary branched polymers. FIG. 6B illustrates a star polymer 606 where there is only one branch point, or core 610. In star polymer 606, each of the arm chains 615 has one of the structures (1), (2), (3), or (4). In advantageous embodiments, all of the arm chains 615 have the same structure (i.e., only one of structure (1)-(4) is present within star polymer 606). Core 610 may be a single atom, or a (macro)molecule. Depending on the technique employed to synthesize star polymer 606, all of arm chains 615 may have very similar molecular weights (i.e., a homogeneous star polymer), or not (i.e., a heterogeneous star polymer). Within a resist film, a plurality of star polymers 606 may advantageously have substantially the same number of arm chains 615, improving consistency and reducing stochastic effects of the resist.

As shown in FIG. 6B, a high molecular weight can be achieved through the additive weights of a plurality of arm chains 615. Individual arm chains 615 may have more moderate molecular weights so that a single scission event anywhere within an arm chain will have a more controlled effect on the molecular weight of star polymer 606. A scission event may for example, remove at most an individual arm chain 615 with a concomitant reduction in molecular weight. Hence, no single scission event could reduce the molecular weight of star polymer 606 in half. Star polymer 606 may also have a lower aggregation number than a linear chain polymer of similar molecular weight. This also should reduce stochastic effects as the inventors understand aggregation to be one source of stochastic variations seen in resist films comprising linear chains.

There are a number of techniques known in the art to form star polymers, including core-first (core initiator), and arm-first (arm chain initiation). In an arm-first approach that may be best suited for resist embodiments herein, each of arm chains 615 may be synthesized as a macromonomer comprising a linear chain with one of the structures (1), (2), (3), or (4), and further including one functional end-group. These functional macromonomers may have some average molecular weight, which are then polymerized into star polymer 606 by directly reacting the functional end (e.g., through anionic polymerization) with a reactive core to arrive at a homogenous star polymer. The number of functional groups on the reactive core may therefore define a consistent number of arms.

FIG. 6C illustrates a hyperbranched (random) polymer 607 where there may be a great number of branch chains 620, each with any number of branch points, which leads to many random branching levels. In hyperbranched polymer 607, all of the branch chains 620 again include one of the structures (1), (2), (3), or (4). Because of the higher-order networking, stochastic effects should be reduced and contrast improved over a linear polymer. Synthesis of hyperbranched polymer 607 may again take a number of forms, such as, radical polymerization or anionic polymerization techniques or catalyzed ring opening metathesis polymerization (ROMP) techniques. For ROMP embodiments, macromonomers that are to become branch chains 620 are synthesized so as to further include a cyclic monomer (e.g., norbornene or cyclooctene) at one chain end.

In some embodiments, the branched polymer has a comb or bottlebrush (molecular brush) architecture. A comb polymer consists of a main (backbone) chain having two or more three-way branch points from which a linear side (branch) chain extends. A bottlebrush polymer consists of a main chain having two or more branch points that have at least four-way functionality and from which multiple linear side, or "bristle" chains may extend. In some advantageous embodiments, the comb or bottlebrush polymer has side chains that will undergo chain scission (i.e., are "scissionable"), and a main chain that does not undergo substantial chain scission (i.e., is "non-scissionable") because much higher energy is required.

FIG. 6D illustrates a bottlebrush polymer 608 that includes a plurality of scissionable side chains 625, each of which branches off of a non-scissionable main chain 630. Unlike a star polymer, bottlebrush polymer 608 has a plurality of branch points off main chain 630. In some exemplary embodiments, there are at least five side chains 625 off main chain 630. Each of the side chains 625 may have one of the monomer structures (1) or (3), or copolymer structures (2) or (4). In advantageous embodiments, all of side chains 625 may have very similar molecular weights (i.e., a homogeneous, or "regular" bottlebrush polymer). For example, all of the side chains 625 may have the same structure (i.e., only one of structure (1)-(4) is present within bottlebrush polymer 608). Main chain 630 may be any suitable polymer having any suitable molecular weight. Although the composition of main chain 630 may vary, in some examples it is a polyacrylate, which, for example, requires a higher scission energy than side chains 625 having the structures (1)-(4).

In addition to having the advantages noted above for other branched polymer architectures, the solubility of bottlebrush polymer 608 may hit a threshold when some number of side chain scissions occur, flipping the state of the polymer from a first (low) solubility state associated with that of side chains 625 to a second (high) solubility state associated with that of main chain 630. For example, side chains 625 may have a first chemical polarity (e.g., non-polar) while main chain 630 has a second, complementary chemical polarity (e.g., polar). Solubility of a given developer chemistry may therefore vary dramatically upon main chain 630 becoming sufficiently exposed as a result of multiple chain scission events. Hence, while main chain 630 may not itself undergo scission, its role in developer solubility may be significant because of chemical differentiation from side chains 625. It should also be noted that a similar solubility threshold may also be possible with star polymers where the core is similarly chemically differentiated from the arm chains.

Synthesis of bottlebrush or comb polymers in accordance with embodiments may again take a number of forms, and embodiments herein are not limited in this context. In a branch chain-first approach that may be best suited for the resist embodiments herein, each of side chains 625 may be synthesized as a macromonomer comprising a linear chain with one of the structures (1), (2), (3), or (4), and further including a functional end-group, such as norbornene or cyclooctene, for example. Ring opening metathesis polymerization (ROMP) may then be employed to attach the functional end-group to main chain 630 branch points.

The various polymer structures described above may be synthesized from any suitable monomer starting materials (resin), for example through a chain polymerization reaction utilizing any suitable initiator. Solid polymers may then be precipitated or otherwise isolated and then dissolved in a suitable casting agent, such as, but not limited to, ethyl acetate, diethylene glycol dimethyl ether, dichlorobenzene, or methoxybenzene. The resist solution comprising the polymer and casting agent may then be stored in a supply bottle for subsequent use.

In a lithography process, the resist solution may be transferred from the supply bottle, and applied over a workpiece, such as a semiconductor substrate (e.g., wafer). Any application process suitable for the material may be employed, such as, but not limited to, a spray-coat or a spin-coating process. The solution may be applied to achieve any suitable thickness (e.g., less than 100-1000 nm) over the workpiece, and then (pre)baked at a predetermined temperature (e.g., 100-200° C.) to remove at least a portion of the casting agent from the applied layer of resist. During a resist patterning operation, radiation (e.g., within the EUV band) may be emitted, for example with any suitable scanner, onto portions of the resist layer based on a reticle. In a pattern develop operation, those portions of the resist layer which have been exposed to the radiation are removed selectively from portions of the resist layer that were not exposed to the radiation. In some embodiments, a wet develop process is employed to dissolve fragments of the polymer resulting from chain scission process(es), such as any of those described above. The wet developer may be any organic solvent for linear polymer embodiments. For branched polymer embodiments where there is chemical differentiation between the main chain (or core) and branch (arm) chains, the developer may be aqueous (e.g., dilute TMAH). Once developed, the resist pattern may be employed in any manner known in semiconductor device manufacture, for example, as a mask of an etch process enlisted to remove a thin film material of the workpiece.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the present disclosure is not limited to the embodiments so described, but can be practiced with modification and alteration without departing from the scope of the appended claims. For example the above embodiments may include specific combinations of features as further provided below.

In first examples, a lithography resist composition comprises a polymer including a monomer having the structural formula

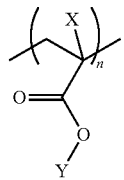

X comprises a halide, an alkyl halide, a tosylate group, a triflate group, or a triflimide group, and Y comprises an aryl or a trialkylsilyl group at the end of an ester chain including one or more carbon atom, or Y comprises an alkyl halide, or aryl halide. In some more specific examples, X is a halide, an alkyl halide, a tosylate group, a triflate group, or a triflimide group, and Y is an aryl or a trialkylsilyl group at the end of an ester chain including one or more carbon atom, or Y is an alkyl halide, or aryl halide.

In second examples, for any of the first examples X is an alkyl halide comprising fluorine.

In third examples, for any of the second examples X is $CF_3$ or $CHF_2CF_3$.

In fourth examples, for any of the first examples Y comprises the alkyl halide or the aryl halide, and wherein Y is a fluoroalkyl, a fluoroarene, an iodoalkyl or an iodoarene.

In fifth examples, for any of the fourth examples Y comprises a trialkylsilylethyl group, and the trialkylsilylethyl group comprises a trimethylsilyl group, a triethylsilyl group, or a triphenylsilyl group. In further examples Y is a trialkylsilylethyl group, and the trialkylsilylethyl group is a trimethylsilyl group, a triethylsilyl group, or a triphenylsilyl group.

In sixth examples, for any of the first through fifth examples the polymer is a homopolymer consisting of the monomer.

In seventh examples, for any of the first through fifth examples the monomer is a first monomer, and the polymer is a copolymer further comprising at least a second monomer.

In eighth examples, for any of the seventh examples, the copolymer has the structural formula

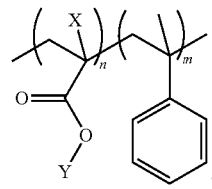

In ninth examples, for any of the seventh examples the copolymer has the structural formula

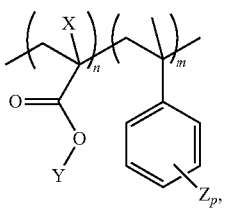

and Z comprises a halide, an alkyl halide, an alkyl group, an alkoxy group, an amino group, or a hydroxyl group, and wherein p is an integer from 1 to 5. In specific examples Z is a halide, an alkyl halide, an alkyl group, an alkoxy group, an amino group, or a hydroxyl group.

In tenth examples, for any of the first through ninth examples the polymer is a linear chain polymer comprising the monomer.

In eleventh examples, for any of the first through tenth examples the polymer is a star polymer comprising a plurality of arm chains, each of the arm chains comprising the monomer, or the polymer is a hyperbranched polymer; or the polymer is a comb or a bottlebrush polymer, the comb or bottlebrush polymer having branch chains comprising the monomer, and a main chain lacking the monomer.

In twelfth examples, a lithography resist composition comprises a polymer including the

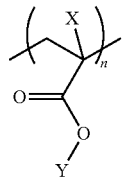

monomer having the structural formula X comprises a fluoroalkyl group, a tosylate group, a triflate group, or a triflimide group, Y comprises an aryl or trialkylsilyl group at the end of an ester chain including one or more carbon atom, or Y comprises an alkyl group, or an alkyl halide, or an aryl halide. In specific examples, X is a fluoroalkyl group, a tosylate group, a triflate group, or a triflimide group, Y is an aryl or trialkylsilyl group at the end of an ester chain including one or more carbon atom, or Y is an alkyl group, or an alkyl halide, or an aryl halide.

In thirteenth examples for any of the twelfth examples X is a tosylate group, or a triflate group.

In fourteenth examples, for any of the twelfth or thirteenth examples Y comprises the alkyl halide or the aryl halide, and Y is a fluoroalkyl, fluoroarene, iodoalkyl or iodoarene.

In fifteenth examples, for any of the twelfth examples the monomer is a first monomer, and the polymer is a copolymer further comprising at least a second monomer.

In sixteenth examples, for any of fifteenth examples the copolymer has the structural formula

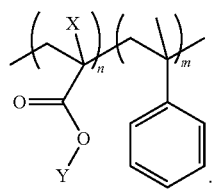

In seventeenth examples, for any of the fifteenth examples the copolymer has the structural formula

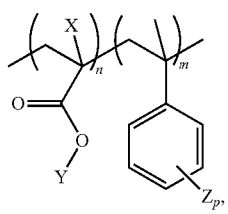

and Z comprises a halide, an alkyl halide, an alkyl group, an alkoxy group, an amino group, or a hydroxyl group, and wherein p is an integer from 1 to 5. In specific examples, Z is a halide, an alkyl halide, an alkyl group, an alkoxy group, an amino group, or a hydroxyl group.

In eighteenth examples, for any of the twelfth through seventeenth examples the polymer is a linear chain polymer, the linear chain comprising the monomer.

In nineteenth examples, for any of the eighteenth examples the polymer is a star polymer comprising a plurality of arm chains, each of the arm chains comprising the monomer, or the polymer is a hyperbranched polymer, or a comb or a bottlebrush polymer, the comb or bottlebrush polymer having branch chains comprising the monomer, and a main chain lacking the monomer.

In twentieth examples, a lithography resist composition comprises a branched polymer including a main polymer chain and two or more branch polymer chains. Each of the branch polymer chains has one of the structural formulas:

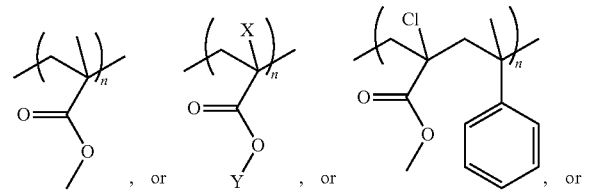

-continued

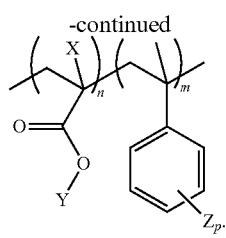

X comprises a halide, an alkyl halide group, a tosylate group, a triflate group, or a triflimide group. Y comprises an aryl or trialkylsilyl group at the end of an ester chain including one or more carbon atom, or Y comprises an alkyl group, an alkyl halide, or an aryl halide. Z comprises a halide, an alkyl halide, an alkyl group, an alkoxy group, an amino group, or a hydroxyl group, and wherein p is an integer from 1 to 5, and the main chain polymer has a structural formula other than that of the branch polymer chains. In specific examples, X is a halide, an alkyl halide group, a tosylate group, a triflate group, or a triflimide group. Y is an aryl or trialkylsilyl group at the end of an ester chain including one or more carbon atom, or Y is an alkyl group, an alkyl halide, or an aryl halide. Z is a halide, an alkyl halide, an alkyl group, an alkoxy group, an amino group, or a hydroxyl group, In twenty-first examples, for any of the twentieth examples the main polymer chain comprises a monomer or copolymer having higher scission energy than that of the branch polymer chains.

In twenty-second examples, for any of the twentieth through twenty-first examples the main chain comprises a polyacrylate.

In twenty-third examples, X comprises a fluoroalkyl group, a tosylate group, a triflate group, or a triflimide group. Y comprises aryl or a trialkylsilylalkyl group at the end of an ester chain including one or more carbon atom, or Y comprises alkyl group, an alkyl halide, or an aryl halide.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the disclosure should, therefore, be determined with reference to the appended claims, along with the full scope of equivalents to which such claims are entitled.

What is claimed is:

1. A lithography resist composition, comprising a branched polymer including a main chain and two or more branch chains, wherein each of the branch chains comprises a polymer including n repeat units of a monomer having the structural formula:

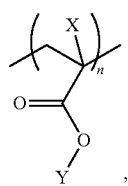

wherein X is a halide, an alkyl halide, a tosylate group, a triflate group, or a triflimide group; and wherein Y is an aryl or aryl halide group at the end of an ester chain including one or more carbon atoms; and wherein the main chain requires a higher scission energy than that of the branch chains.

2. The lithography resist composition of claim 1, wherein Y is a fluoroarene or an iodoarene.

3. The lithography resist composition of claim 1, wherein the polymer of the branch chains is a homopolymer consisting of the monomer.

4. The lithography resist composition of claim 1, wherein the monomer is a first monomer, and the polymer of the branch chains is a copolymer further comprising at least a second monomer.

5. The lithography resist composition of claim 4, wherein the copolymer of the branch chains comprises m repeat units of the second monomer, and has the structural formula:

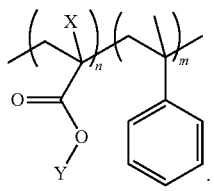

6. The lithography resist composition of claim 4, wherein the copolymer of the branch chains comprises m repeat units of the second monomer, and has the structural formula:

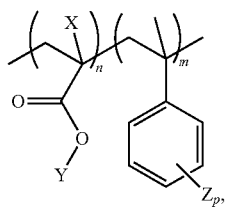

and wherein Z is a halide, an alkyl halide, an alkyl group, an alkoxy group, an amino group, or a hydroxyl group, and wherein p is an integer from 1 to 5.

7. The lithography resist composition of claim 1, wherein the polymer of the branch chains is a linear chain polymer comprising the monomer.

8. The lithography resist composition of claim 1, wherein:
the branched polymer is a comb or a bottlebrush polymer, the comb or bottlebrush polymer having branch chains comprising the monomer, and a main chain lacking the monomer.

9. The lithography resist composition of claim 1, wherein the main chain comprises a polyacrylate.

10. A lithography resist composition, comprising a polymer including n repeat units of the monomer having the structural formula:

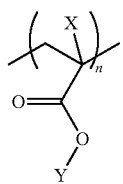

wherein X is a tosylate group, a triflate group, or a triflimide group; and wherein Y is an aryl or trialkylsilyl group at the end of an ester chain including one or more carbon atom, or Y is an alkyl group, an alkyl halide, or an aryl halide.

11. The lithography resist composition of claim 10, wherein X is a tosylate group or a triflate group.

12. The lithography resist composition of claim 11, where Y is the alkyl halide or the aryl halide, and wherein Y is a fluoroalkyl, a fluoroarene, an iodoalkyl or an iodoarene.

13. The lithography resist composition of claim 10, wherein the monomer is a first monomer, and the polymer is a copolymer further comprising at least a second monomer.

14. The lithography resist composition of claim 13, wherein the copolymer comprises m repeat units of the second monomer, and has the structural formula:

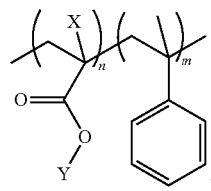

15. The lithography resist composition of claim 13 wherein the copolymer has the structural formula:

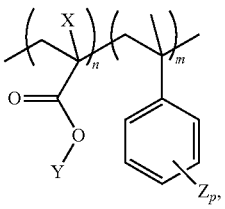

and wherein Z is a halide, an alkyl halide, an alkyl group, an alkoxy group, an amino group, or a hydroxyl group, and wherein p is an integer from 1 to 5.

16. The lithography resist composition of claim 10, wherein the polymer is a linear chain polymer, the linear chain comprising the monomer.

17. The lithography resist composition of claim 10, wherein:
the polymer is a star polymer comprising a plurality of arm chains, each of the arm chains comprising the monomer; or the polymer is a hyperbranched polymer; or the polymer is a comb or a bottlebrush polymer, the comb or bottlebrush polymer having branch chains comprising the monomer, and a main chain lacking the monomer.

* * * * *